United States Patent [19]

Grapentin et al.

[11] Patent Number: 4,940,554
[45] Date of Patent: Jul. 10, 1990

[54] CONDITIONING AGENT FOR THE TREATMENT OF BASE MATERIALS

[75] Inventors: Hans-Joachim Grapentin; Hubert-Matthias Seidenspinner; Detlef Tessmann, all of Berlin, Fed. Rep. of Germany

[73] Assignee: Schering Aktiengesellschaft, Berlin & Bergkamen, Fed. Rep. of Germany

[21] Appl. No.: 152,539

[22] Filed: Feb. 5, 1988

Related U.S. Application Data

[63] Continuation of Ser. No. 899,922, Aug. 25, 1986, Pat. No. 4,781,990.

[30] Foreign Application Priority Data

Aug. 23, 1985 [DE] Fed. Rep. of Germany ....... 3530617

[51] Int. Cl.$^5$ ............................................ C07D 293/12
[52] U.S. Cl. ................................... 252/357; 106/1.11; 427/444
[58] Field of Search ....................... 252/357; 106/1.11; 427/444

[56] References Cited

U.S. PATENT DOCUMENTS

| | | | |
|---|---|---|---|
| 2,592,273 | 4/1952 | Goebel et al. | 252/357 |
| 2,971,006 | 2/1961 | Mayhew | 252/357 |
| 3,791,986 | 2/1974 | Mallico | 252/357 |
| 4,109,094 | 8/1978 | Trivedi et al. | 548/347 |
| 4,301,196 | 11/1981 | McCormack et al. | 427/443.1 |
| 4,504,668 | 3/1985 | Kampfer et al. | 548/325 |
| 4,643,793 | 2/1987 | Nakaso et al. | 427/98 |

OTHER PUBLICATIONS

Condensed Chemical Dictionary 9th Ed. "alkyl aryl polyethylene glycol ether".

*Primary Examiner*—Mary C. Lee
*Assistant Examiner*—Catherine S. K. Scalzo
*Attorney, Agent, or Firm*—Michael J. Striker

[57] ABSTRACT

A conditioning agent is disclosed, for the pre-treatment of base materials for subsequent complete and uniform chemical metallization, characterized by a content of a quaternary organic nitrogen compound. Also disclosed is a process for the pre-treatment of base materials, employing said conditioning agent. Preferred embodiments include as active agent at least one compound of the general formula

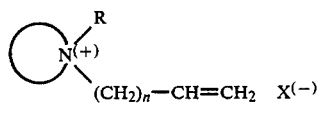

wherein

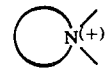

represents a cyclical nitrogen compound,
R is hydrogen, $C_1$–$C_4$-alkyl or hydroxy-$C_1$–$C_2$-alkyl,
n is 0 or 1, and
$X^{(-)}$ is the anion of an inorganic or an organic acid.

15 Claims, No Drawings

CONDITIONING AGENT FOR THE TREATMENT OF BASE MATERIALS

This is a continuation of application Ser. No. 899,922, filed Aug. 25, 1986 now U.S. Pat. No. 4,781,990.

BACKGROUND OF THE INVENTION

The invention relates to a conditioning agent the treatment of base materials as a preparation for a subsequent complete and uniform chemical metallization.

The term conditioning is meant to include the preparation or alteration of a substrate surface, including any filler material (for example, glass fibers), with the aim of positively influencing the chemical metallization by guaranteeing a complete and uniform activation (i.e. seeding).

A pretreatment with a suitable activator can promote the metallization. This pretreatment improves the adhesion between the substrate and the metal, which is extensively dependent on the particular etching method used.

It is therefore an object according to the present invention to produce a conditioning agent for the pretreatment of base materials, having outstanding characteristics.

SUMMARY OF THE INVENTION

This object is attained according to the present invention by a conditioning agent of the above designated type, comprising an aqueous solution of a quaternary salt of N-alkenyl-substituted cyclical nitrogen compounds of the formula (I):

$$\underset{(CH_2)_n-CH=CH_2}{\overset{R}{\underset{|}{N^{(+)}}}} \quad X^{(-)} \tag{I}$$

wherein $$\overset{}{\underset{}{N^{(+)}}}$$

represents a cyclical nitrogen cation,

R represents a member selected from the group consisting of hydrogen, alkyl radicals having from one to four carbon atoms, hydroxy-substituted alkyl radicals having from one to four carbon atoms, n is 0 or 1, and $X^{(-)}$ is an anion of an inorganic or an organic acid.

The conditioning agent according to the present invention causes an increased activation of the surfaces of base materials compared to agents known from the state of the art, and thereby makes possible their complete and uniform chemical metallization.

It is of particular advantage that the conditioning agent according to the present invention makes possible equally good metallizations with all known activator systems, according to the following general operational procedure:
1. conditioning;
2. metal etching;
3. activation; and
4. chemical metallization.

As a rule, a cleaning is still a prerequisite for the conditioning. However, the cleaning can also be performed simultaneously with the conditioning.

Generally, the activation is undertaken with palladium-containing solutions, but can, however, be performed with other precious metal salt solutions, for example the silver salts.

The quaternary organic nitrogen compounds according to the present invention are known per se or can be prepared according to known methods.

Compounds with particularly outstanding activity include, for example,
N-methyl-N'-vinylimidazolium methosulfate,
N-methyl-N'-vinylimidazolium chloride,
N-methyl-N-vinylpyrrolidonium chloride,
N-methyl-N'-allylimidazolium iodide,
N-methyl-N-vinyl-ε-caprolactam-quaternary salt,
N-butyl-N'-allylbenzimidazolium methosulfate, and
N-methyl-N'-vinylimidazolium-bromide or methane sulfonate.

These active agents are used, preferably in aqueous solutions, in concentrations of from 0.01 to 10 g/l.

The compounds according to the present invention are suitable for the pre-treatment of all known base materials, such as for example epoxide resin papers, phenol resin, polyimide, polyamide, polystyrene, polyethylene, polyvinylchloride, polycarbonate, acrylate, acrylonitrile-butadiene-styrene block polymerizate, polysulfone, polyester, teflon, glass or ceramic.

The pre-treatment includes any means of thoroughly contacting the conditioning agent with the base material, such as for example, steeping, soaking, immersing, wiping on with a sponge or towel, spraying on, and the like.

The activity of the compounds to be employed according to the present invention can be increased, in surprising manner, when they are employed in combination with dicarboxylic acid, preferably oxalic acid, malonic acid, succinic acid, glutaric acid, adipic acid or maleic acid, advantageously in concentrations from 1 up to 10 g/l, and preferably 5 g/l.

The simultaneous presence of a cleaning agent based upon a non-ionogenic wetting agent, preferably alkylphenolpolyglycolether, and an active agent is possible, so that the cleaning operation can be combined with the conditioning, which is technically advantageous.

The composition according to the present invention is employed at temperatures from about 15° to 30° C., preferably 20° C. However, the operational temperature has no noteworthy influence upon the coating results.

The conditioning agent according to the present invention finds use in the production of circuit boards and circuits in the fields of electronics and electrical engineering.

The invention will be more closely illustrated and described by the following examples of specific embodiments:

EXAMPLES

Example 1

A chemical metallization process is performed with a copper-coated epoxide-glass fiber material according to the following as TABLE I: follows:

TABLE I

RT represents room temperature

| | Time (min.) | temperature (°C.) |
|---|---|---|
| 1. Cleaning | 5 (4–6) | 40 (RT - 80) |
| 2. Etch cleaning, for example $H_2SO_4/H_2O_2$ - etch | 1 (0.5–3) | 30 (RT - 40) |
| 3. Activation | 5 (4–6) | 30 (RT - 50) |
| 4. Chemical metallization, for example, copper | | |

A non-ionogenic wetting agent, for example based upon alkylphenolpolyglycolether, which is suitable for epoxide, is employed as conventional cleaner. However, the cleaner does not contain a compound with conditioning characteristics.

The resultant coating of the glass fibers was not 100% complete after a copper deposition having an average thickness of 5 micrometers. This was also true when there was an acid cleaning, a neutral cleaning or even a combined two stage cleaning with acid and alkali, in that order or the reverse.

Example 2

Example 1 is repeated, however a combined conditioning and cleaning with a strongly alkaline cleaner is performed with addition to the single-stage strongly alkaline cleaner (pH=greater than 13) of 10 mg/l of a quaternary organic nitrogen compound based upon N-methyl-N'-vinylimidazolium methosulfate.

A closed metallization is produced on the base material after deposition of about 5 μm copper.

Example 3

Example 2 is repeated, using an addition to the cleaner of 100 mg/l of N-methyl-N'-vinylimidazolium methosulfate.

A 100% coating is achieved after deposition of about 3 μm copper.

Example 4

Example 2 is repeated, using an addition to the cleaner of 250 mg/l of N-methyl-N'-vinylimidazolium chloride.

A complete copper coating is obtained already after a layer thickness of about 0.5 μm.

Example 5

Example 2 is repeated, using an addition to the cleaner of 1 g/l of N-methyl-N'-vinylimidazolium methosulfate.

A 100% coating is obtained already after a layer thickness of about 0.5 μm.

Example 6

Example 2 is repeated, using an addition to the cleaner of 10 g/l of N-methyl-N'-vinylimidazolium methosulfate.

A complete metallization is obtained after a layer thickness of approximately 0.5 μm.

Example 7

Example 4 is repeated, using a further addition to the cleaner of 5 g/l succinic acid.

An improved conditioning is observed. The copper coating is 100% already after an approximate layer thickness of 0.2 μm.

Example 8

Examples 2 through 7 are repeated, using a single-stage strongly acid cleaner (pH=less than 1), to which is added either 10 mg/l, 100 mg/l, 1 g/l or 10 g/l of a quaternary organic nitrogen compound based upon N-methyl-N'-vinylimidazolium methosulfate.

The test findings correspond to the results set forth in Examples 2 through 7.

Example 9

Example 8 is repeated, using a single-stage cleaner in a neutral medium, containing an addition of a compound based upon N-methyl-N'-vinylimidazolium methosulfate.

Here, too, improvements in the metallizations are observed.

Example 10

Example 7 is repeated, using a double-stage alkaline/acid cleaner pre-treatment.

A closed, 100% chemical coppering is obtained already after a layer thickness of about 0.1 μm.

Example 11

A repeat of test 10, with a double-stage acid/alkaline cleaner pre-treatment provides analogous results.

Example 12

The tests of Example 2 through 11 are repeated, using plasma-etched, multiple layered circuits (multilayers). A complete coating with electroless copper (i.e. chemical metallization) is obtained already after a layer thickness of about 0.2 μm.

Example 13

Results similar to those of test 12 are obtained when multiple layer circuits (multilayers) are etched with concentrated sulfuric acid, chromic, or with an alkaline potassium permanganate solution.

Example 14

Results analogous to those of Examples 2 through 11 are obtained when the palladium content in the ionogenic activator is lowered from 200 mg/l to 75 mg/l.

Example 15

Results analogous to those of Examples 2–11 are obtained when the palladium concentration in a colloidal, tin(II)-containing and acid activator is reduced from 200 mg/l to 100 mg/l.

Example 16

A repeat of Examples 1 through 11, with silver-containing and copper-containing activators, provides comparable results.

Example 17

Examples 10 and 11 are repeated, using as base material, epoxide resin paper, phenol resin, polyimide, polyamide, acrylonitrile-butadiene-styrene block polymerizate (ABS), polysulfone, teflon and porcelain. Analogous results are obtained.

Example 18

Examples 2 through 17 are repeated, using a chemical nickel bath. The conditioning agent according to the present invention causes a coating-promoting activity when the metallization is effected with electroless nickel baths.

While the invention has been described and illustrated as embodied in a conditioning agent for the treatment of base materials, it is not intended to be limited to the details shown, since various modifications and structural changes may be made without departing in any way from the spirit of the present invention.

Without further analysis, the foregoing will so fully reveal the gist of the present invention that the skilled man of the art will be able to practice the same without undue experimentation and without omitting features that, from the standpoint of prior art, fairly represent the generic or specific aspects of the present invention.

What is claimed to be new and desired to be protected by Letters Patent is set forth in the following claims:

1. Conditioning agent for treatment of base materials for subsequent complete and uniform metallization comprising an aqueous solution of a non-ionogenic cleaning agent an active agent selected from the group consisting of quaternary salts of N-alkenyl-substituted cyclical nitrogen compounds of formula (I):

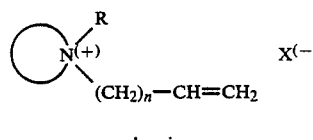

wherein

represents a cyclical nitrogen cation,
R is a member selected from the group consisting of hydrogen, alkyl radicals containing from 1 to 4 carbon atoms and hydroxy-substituted alkyl radicals containing from 1 to 4 carbon atoms,
n is a member selected from the group consisting of 0 and 1,
and $X^{(-)}$ is a member selected from the group consisting of anions of inorganic acids and anions of organic acids.

2. The conditioning agent according to claim 1 wherein

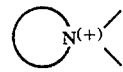

represents a radical selected from the group consisting of pyrrolidon-, imidazolin-, imidazol-, ε-caprolactam- and benzimidazol-.

3. The conditioning agent according to claim 1 in which said active agent comprises N-methyl-N'-vinylimidazolium chloride.

4. The conditioning agent according to claim 1 in which said active agent comprises N-methyl-N'-vinylimidazolium methosulfate.

5. The conditioning agent according to claim 1 in which said active agent comprises N-methyl-N-vinylpyrrolidonium chloride.

6. The conditioning agent according to claim 1 in which said active agent comprises N-methyl-N'-allylimidazolium iodide.

7. The conditioning agent according to claim 1 in which said active agent comprises N-methyl-N-vinyl-ε-caprolactam-quaternary salt.

8. The conditioning agent according to claim 1 in which said active agent comprises N-butyl-N'-allylbenzimidazolium methosulfate.

9. The conditioning agent according to claim 1 in which said active agent comprises a copolymerizate of N-methyl-N'-vinylimidazolium chloride and vinyl pyrrolidon.

10. The conditioning agent according to claim 1 in which said active agent is present in a concentration of from about 0.01 to 10 g/l.

11. The conditioning agent according to claim 1 further comprising a dicarboxylic acid.

12. The conditioning agent according to claim 11 wherein said dicarboxylic acid is selected from the group consisting of oxalic acid, malonic acid, succinic acid, glutaric acid, adipic acid and maleic acid.

13. The conditioning agent according to claim 11 in which said dicarboxylic acid is contained in a concentration of from 1 to 10 g/l.

14. The conditioning agent according to claim 13 in which said concentration of said dicarboxylic acid is 5 g/l.

15. Conditioning agent for treatment of base materials for subsequent complete and uniform metallization comprising a nonionogenic cleaning agent; a dicarboxylic acid selected from the group consisting of oxalic acid, malonic acid, succinic acid, glutaric acid, adipic acid and maleic acid; and an aqueous solution of an active agent selected from the group consisting of quaternary salts of N-alkenyl-substituted cyclical nitrogen compounds of formula (I):

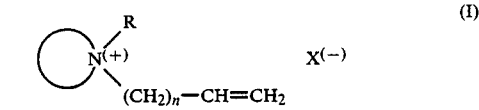

wherein

represents a cyclical nitrogen cation,
R is a member selected from the group consisting of hydrogen, alkyl radicals containing from 1 to 4 carbon atoms and hydroxy-substituted alkyl radicals containing from 1 to 4 carbon atoms,
n is a member selected from the group consisting of 0 and 1, and $X^{(-)}$ is a member selected from the group consisting of anions of inorganic acids and anions of organic acids.

* * * * *